United States Patent
Song et al.

(10) Patent No.: US 11,106,068 B2
(45) Date of Patent: Aug. 31, 2021

(54) METHOD OF MANUFACTURING DISPLAY DEVICE, AND DEVICE FOR MANUFACTURING DISPLAY DEVICE

(71) Applicant: Samsung Display Co., LTD., Yongin-si (KR)

(72) Inventors: Si Joon Song, Suwon-si (KR); Eui Jeong Kang, Suwon-si (KR); Byoung Yong Kim, Seoul (KR); Dae Hyuk Im, Daegu (KR); Young Min Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/897,986

(22) Filed: Jun. 10, 2020

(65) Prior Publication Data

US 2021/0103178 A1 Apr. 8, 2021

(30) Foreign Application Priority Data

Oct. 8, 2019 (KR) ........................ 10-2019-0124415

(51) Int. Cl.
| | |
|---|---|
| *G02F 1/1333* | (2006.01) |
| *H05K 13/08* | (2006.01) |
| *G02F 1/1345* | (2006.01) |
| *G02F 1/1335* | (2006.01) |
| *G02F 1/13357* | (2006.01) |

(52) U.S. Cl.
CPC .... *G02F 1/133325* (2021.01); *G02F 1/13452* (2013.01); *H05K 13/08* (2013.01); *G02F 1/1336* (2013.01); *G02F 1/133308* (2013.01); *G02F 1/133322* (2021.01); *G02F 1/133553* (2013.01)

(58) Field of Classification Search
None
See application file for complete search history.

(56) References Cited

U.S. PATENT DOCUMENTS

| | | | |
|---|---|---|---|
| 2015/0082621 A1* | 3/2015 | Yamada | G02F 1/1303 29/740 |
| 2018/0067354 A1* | 3/2018 | Son | H05K 1/144 |
| 2019/0088584 A1 | 3/2019 | Won et al. | |
| 2019/0206784 A1* | 7/2019 | Oh | H01L 23/49838 |

FOREIGN PATENT DOCUMENTS

| | | |
|---|---|---|
| KR | 1020140136237 A | 11/2014 |
| KR | 1020170067520 A | 6/2017 |

* cited by examiner

*Primary Examiner* — Phu Vu
(74) *Attorney, Agent, or Firm* — Cantor Colburn LLP

(57) ABSTRACT

A method of manufacturing a display device includes fixing a display panel to a stage, attaching a printed circuit board to a first side surface of the fixed display panel, and irradiating the first side surface of the display panel with light from a first lighting and irradiating a second side surface of the display panel opposite the first side surface of the display panel with light from a second lighting to check alignment of the printed circuit board.

20 Claims, 17 Drawing Sheets

METHOD OF MANUFACTURING DISPLAY DEVICE, AND DEVICE FOR MANUFACTURING DISPLAY DEVICE

This application claims priority to Korean Patent Application No. filed 10-2019-0124415 on Oct. 8, 2019, and all the benefits accruing therefrom under 35 U.S.C. § 119, the content of which in its entirety is herein incorporated by reference.

BACKGROUND

1. Field of the Disclosure

The present disclosure relates to a method of manufacturing a display device, and a device for manufacturing the same.

2. Description of the Related Art

A display device is a device configured to display a video or a still image, and can be used as a display screen of not only each of portable electronic devices such as a mobile phone, a smart phone, a tablet PC, a smart watch, a watch phone, a mobile communication terminal, an electronic notebook, an electronic book, a portable multimedia player ("PMP"), a navigation device, an ultra mobile personal computer ("UMPC"), and the like but also each of various products such as a television, a notebook, a monitor, a billboard, an internet of things, or the like.

In order to drive light emitting elements of a display device, a printed circuit board including a driving circuit, a plurality of signal lines configured to electrically connect the light emitting elements, and a plurality of lead lines connected to the plurality of signal lines is commonly used. The display device includes a display area in which an image is displayed and a portion configured to surround the display area and in which the image is not displayed, that is, a bezel. In order to realize a bezelless display device, the signal lines and the lead lines may be bonded at a side surface of the display device.

SUMMARY

An exemplary embodiment of the invention provides a method of manufacturing a display device in which it is capable to check alignment between a side pad and a lead line bonded at a side surface of a display panel.

Another exemplary embodiment of the invention provides a device for manufacturing the display device in which it is capable to check alignment between a side pad and a lead line bonded at a side surface of a display panel.

However, features of the invention are not restricted to the one set forth herein. The above and other features of the invention will become more apparent to one of ordinary skill in the art to which the invention pertains by referencing the detailed description of the invention given below.

According to an exemplary embodiment, a method of manufacturing a display device includes an operation of fixing a display panel to a stage, an operation of attaching a printed circuit board to first side surface of the fixed display panel, and an operation of irradiating first side surface of the display panel with light from a first lighting, and irradiating a second side surface of the display panel opposite the first side surface of the display panel with light from a second lighting to check alignment of the printed circuit board.

In an exemplary embodiment, the display panel may be fixed through absorption of air in a vacuum hole of the stage in the operation of fixing the display panel to the stage.

In an exemplary embodiment, the method may further include an operation of flipping the stage to allow the display panel to stand up, between the operation of fixing the display panel and the operation of attaching the printed circuit board.

In an exemplary embodiment, the stage may keep fixing of the display panel in the operation of flipping the stage to allow the display panel to stand up.

In an exemplary embodiment, a stopper of the stage may fix the second side surface of the display panel in the operation of flipping the stage to allow the display panel to stand up.

In an exemplary embodiment, the printed circuit board may be attached to the first side surface of the display panel in a state in which the display panel is stood up in the operation of attaching the printed circuit board to the first side surface of the fixed display panel.

In an exemplary embodiment, the second lighting may be embedded in the stage in the operation of irradiating the second side surface of the display panel opposite the first side surface of the display panel with light from the second lighting.

In an exemplary embodiment, the second lighting may be disposed in the stopper of the stage.

In an exemplary embodiment, the operation of irradiating the second side surface of the display panel opposite the first side surface of the display panel with light from the second lighting to check the alignment of the printed circuit board may include an operation of reflecting the light irradiated from the second lighting through a reflection layer disposed between the display panel and the stage to check the alignment of the printed circuit board.

In an exemplary embodiment, the printed circuit board may be attached to the first side surface of the display panel in a state in which the display panel is laid in the operation of attaching the printed circuit board to the first side surface of the fixed display panel.

In an exemplary embodiment, the display panel may include a liquid crystal display panel.

In an exemplary embodiment, the operation of checking the alignment of the printed circuit board may include an operation of checking alignment between a side surface pad disposed on the first side surface of the display panel and a lead line of the printed circuit board.

In an exemplary embodiment, the operation of checking the alignment of the printed circuit board may include an operation of checking an indentation due to a conductive ball of an anisotropic conductive film disposed between the side surface pad and the lead line.

According to another exemplary embodiment, a device for manufacturing a display device includes a substrate seating and fixing part which seats a display panel thereon and fixes the display panel, a stopper connected to the substrate seating and fixing part, and disposed on a second side surface of the display panel, and a light source part connected to the stopper and which irradiates the second side surface of the display panel with illumination light.

In an exemplary embodiment, the substrate seating and fixing part may define a plurality of vacuum holes passing through a surface thereof in a thickness direction.

In an exemplary embodiment, the light source part may be disposed in the stopper.

In an exemplary embodiment, the illumination light irradiated from the light source part may proceed from the second side surface of the display panel to a first side surface of the display panel opposite the second side surface of the display panel.

In an exemplary embodiment, the device for manufacturing a display device may further include a reflection layer disposed on a major surface of the substrate seating and fixing part where the reflection layer may reflect the illumination light provided from the light source part.

In an exemplary embodiment, the device for manufacturing a display device may further include a flip part, where the flip part may allow the laid display panel to stand up.

In an exemplary embodiment, the stopper may support the second side surface of the display panel opposite the first side surface of the stood display panel.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION

Figure 1:
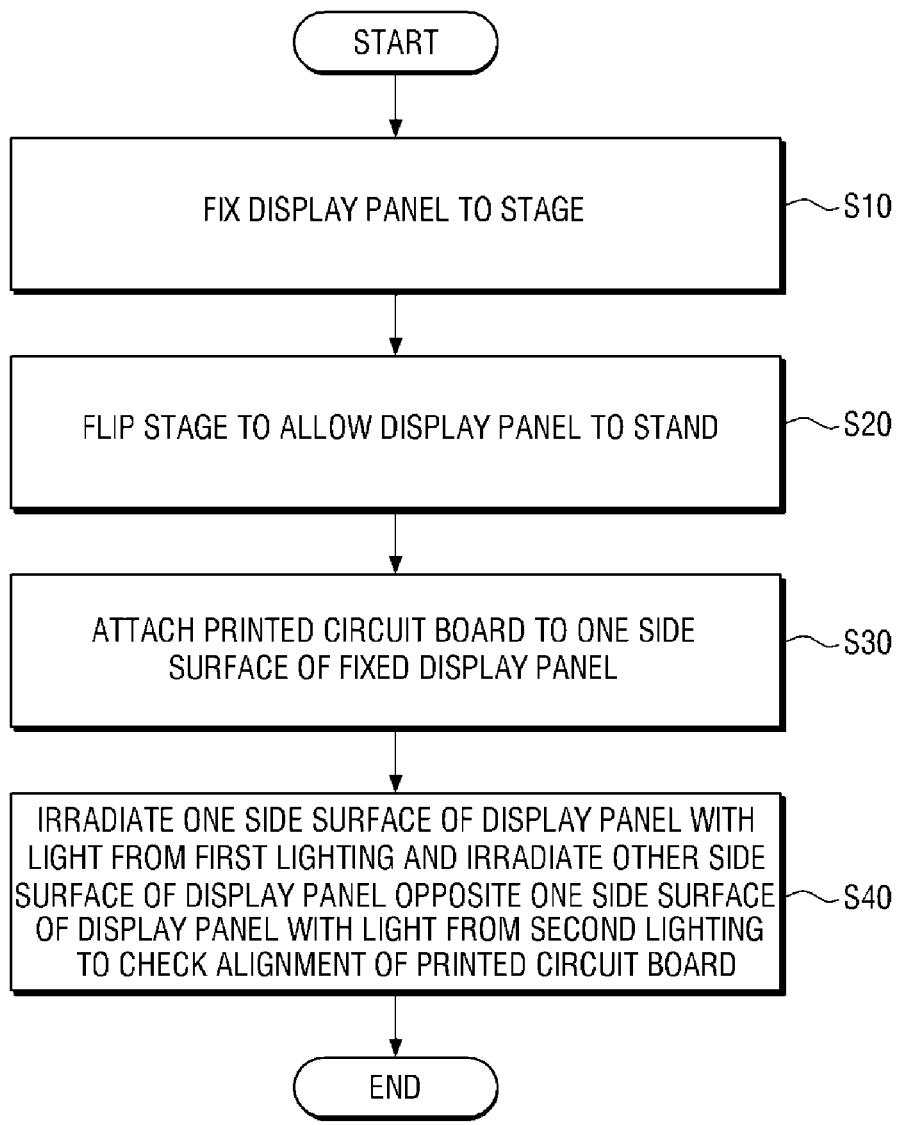
FIG. 1 is a flow chart of a method of manufacturing a display device according to an exemplary embodiment.

Advantages and characteristics of the present disclosure and a method of achieving the above will be apparent with reference to exemplary embodiments which will be described in detail with the accompanying drawings. However, the present disclosure is not limited to the exemplary embodiments which will be described below and may be implemented in different forms. That is, the present disclosure is only defined by the scope of the claims.

A case in which an element or a layer is "above" or "on" another element or layer includes both cases in which not only the element or layer are directly on another element or layer but also another element or layer is interposed between the element or layer and the other element or layer. On the other hand, a case in which the element or the layer is "directly on" or "directly above" another element or layer refers to a case in which no other elements or layer are interposed between the element or layer and the other element or layer. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The same reference numerals will be used for the same or similar components through the entire specification.

Hereinafter, exemplary embodiments of the present disclosure will be described with reference to the accompanying drawings.

Figure 2:
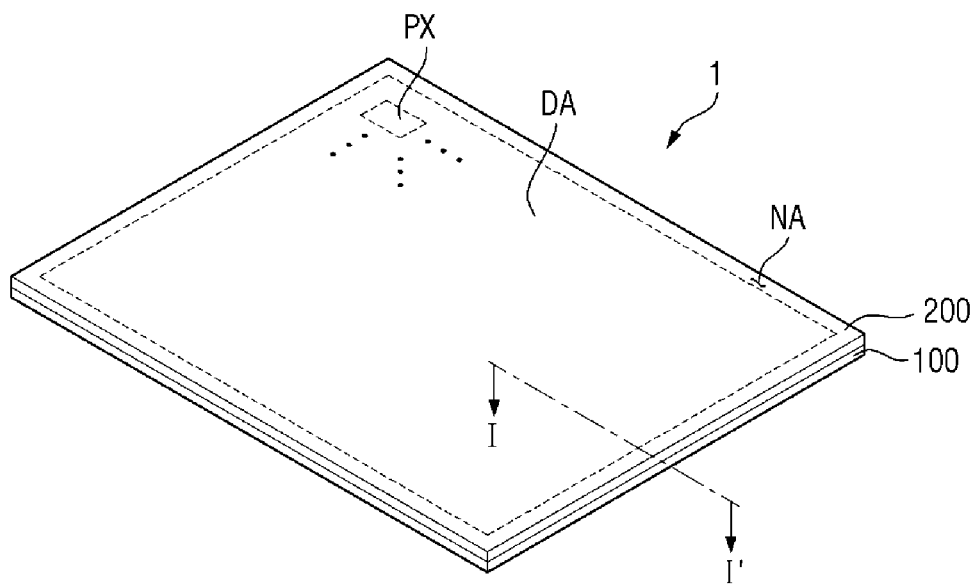
FIGS. 2, 4, 5, 6, 7, and 10 are perspective views of process operations of the method of manufacturing a display device according to an exemplary embodiment.
Figure 3:
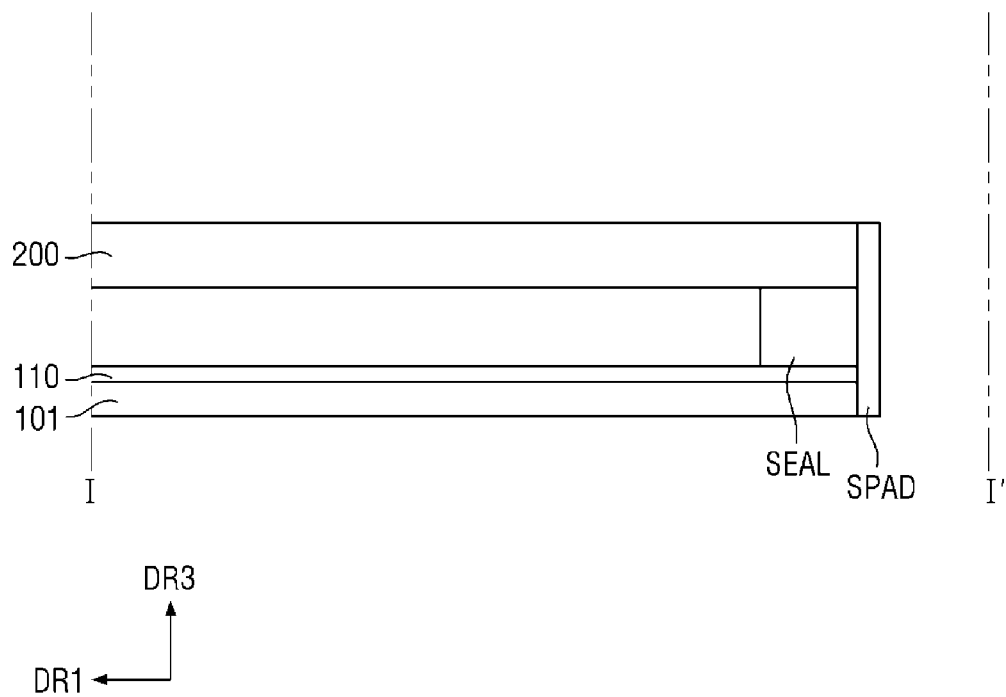
FIG. 3 is a cross-sectional view taken along line I-I' of FIG. 2.
Figure 5:
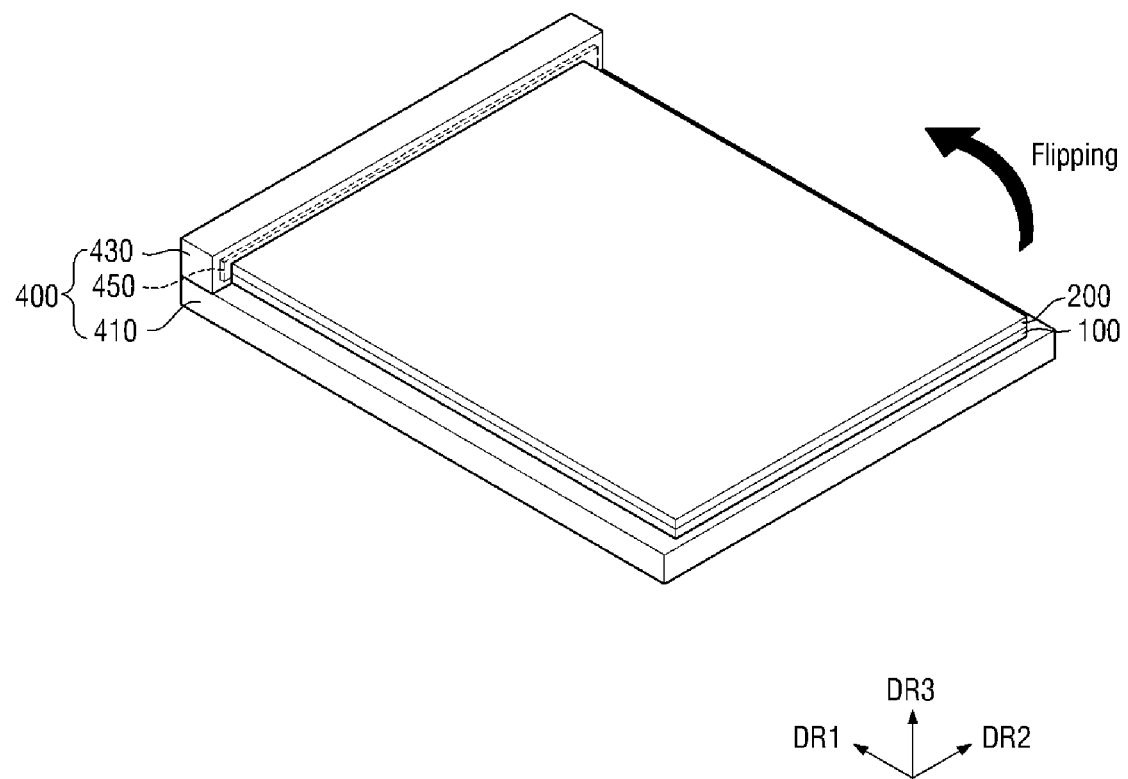
Figure 6:
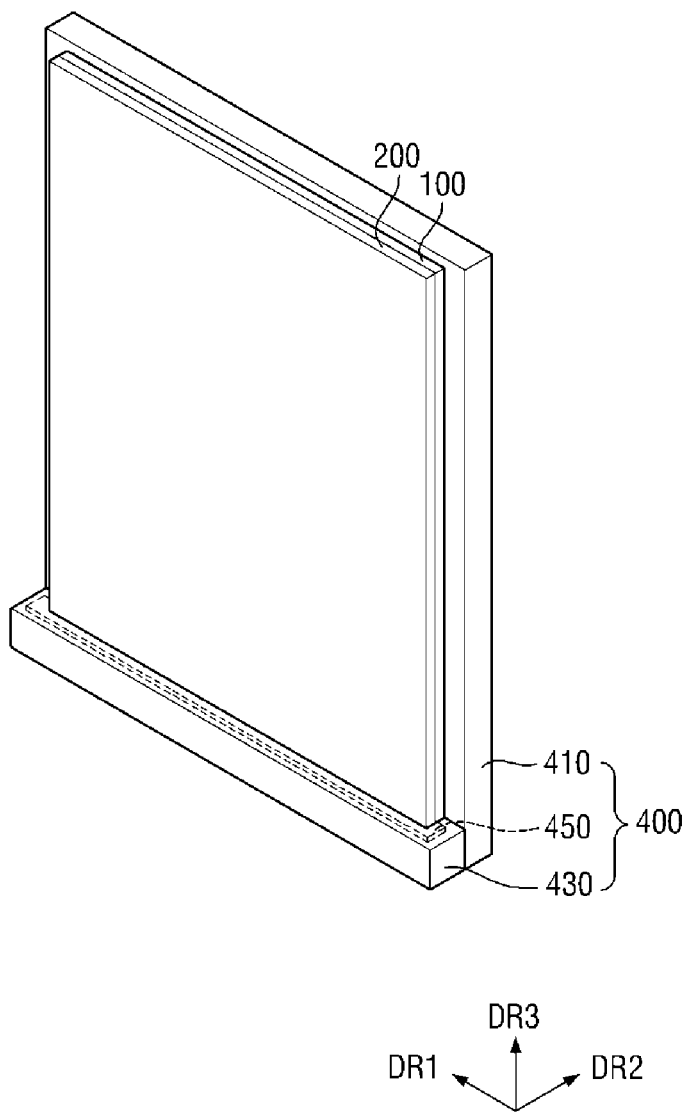
Figure 7:
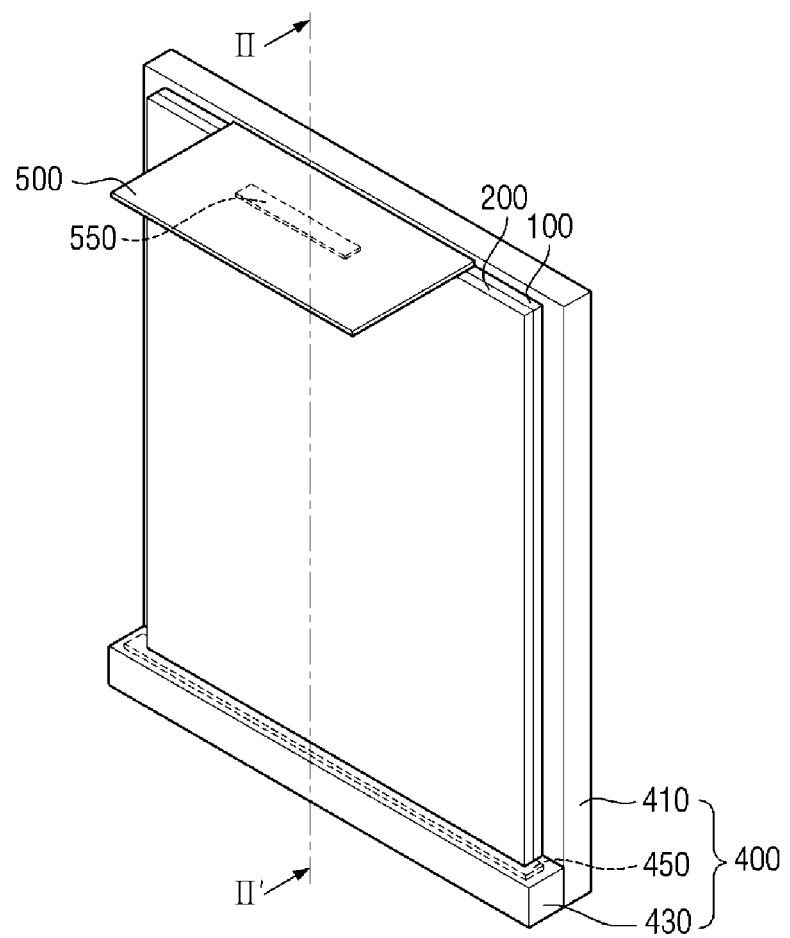
Figure 8:
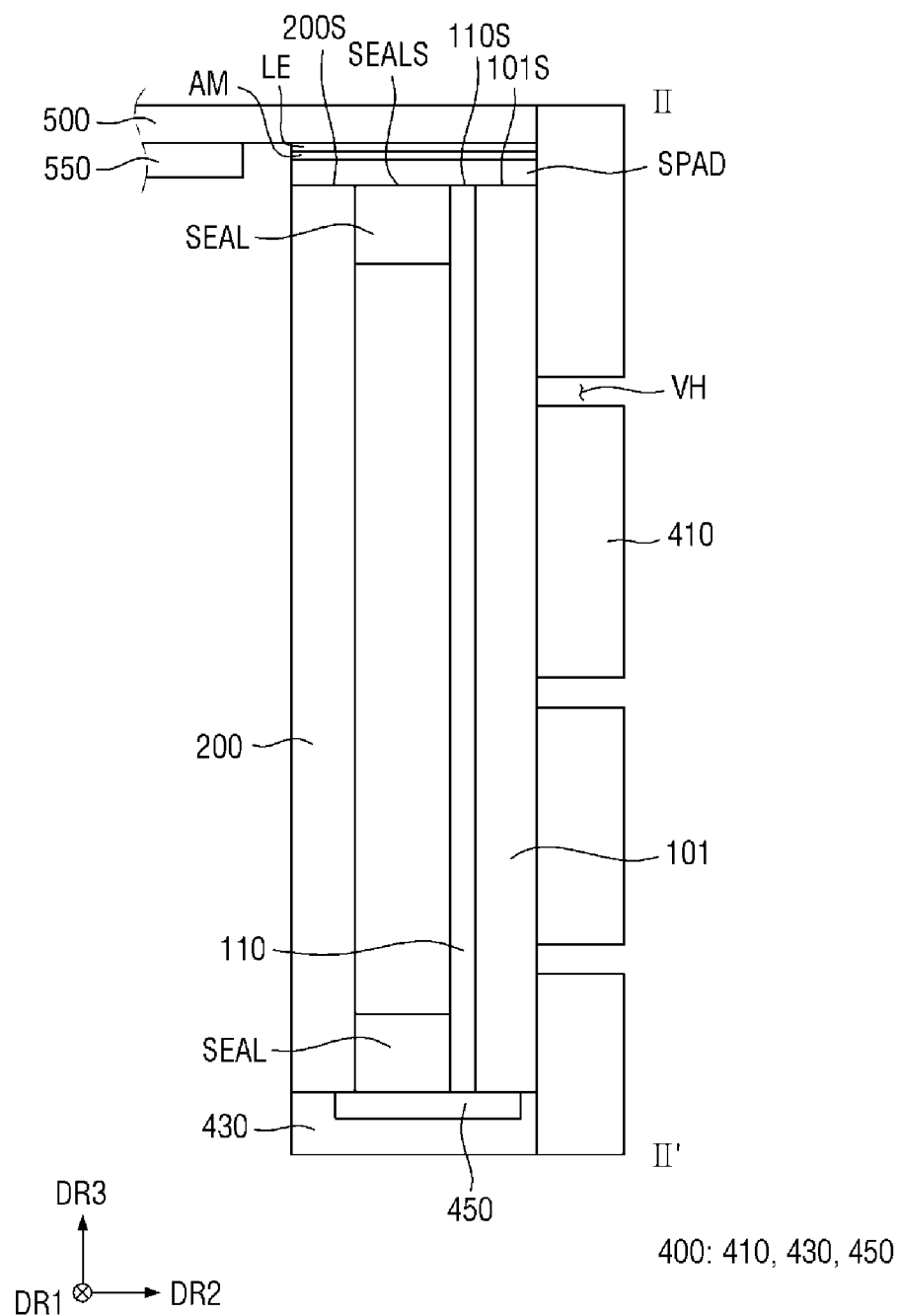
FIG. 8 is a cross-sectional view taken along line II-II' of FIG. 7.
Figure 9:
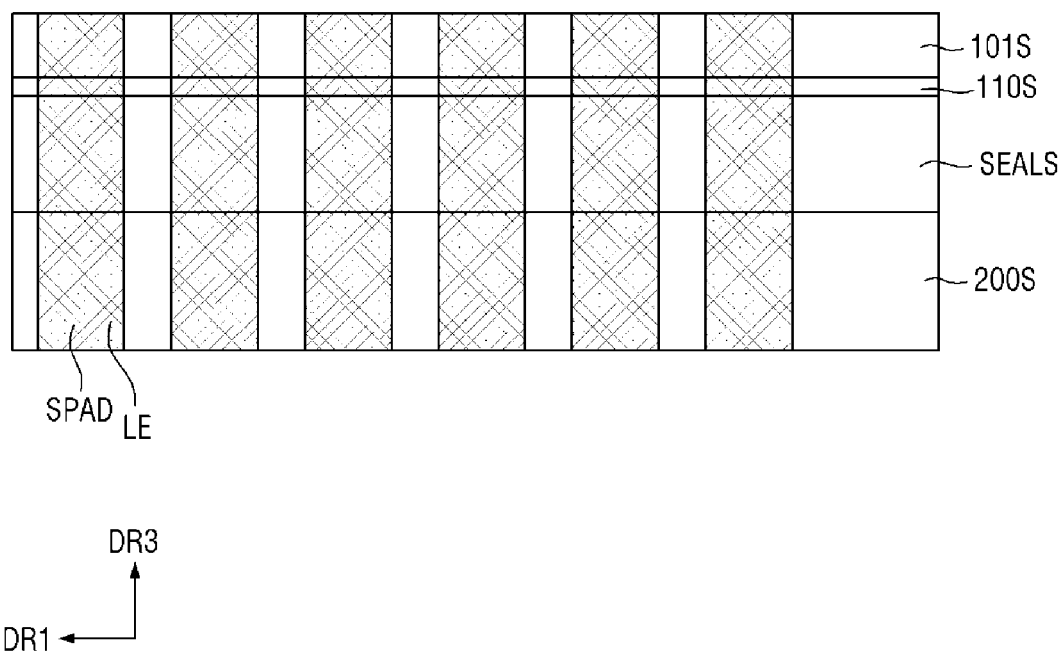
FIG. 9 is a partial view of FIG. 8.
Figure 10:
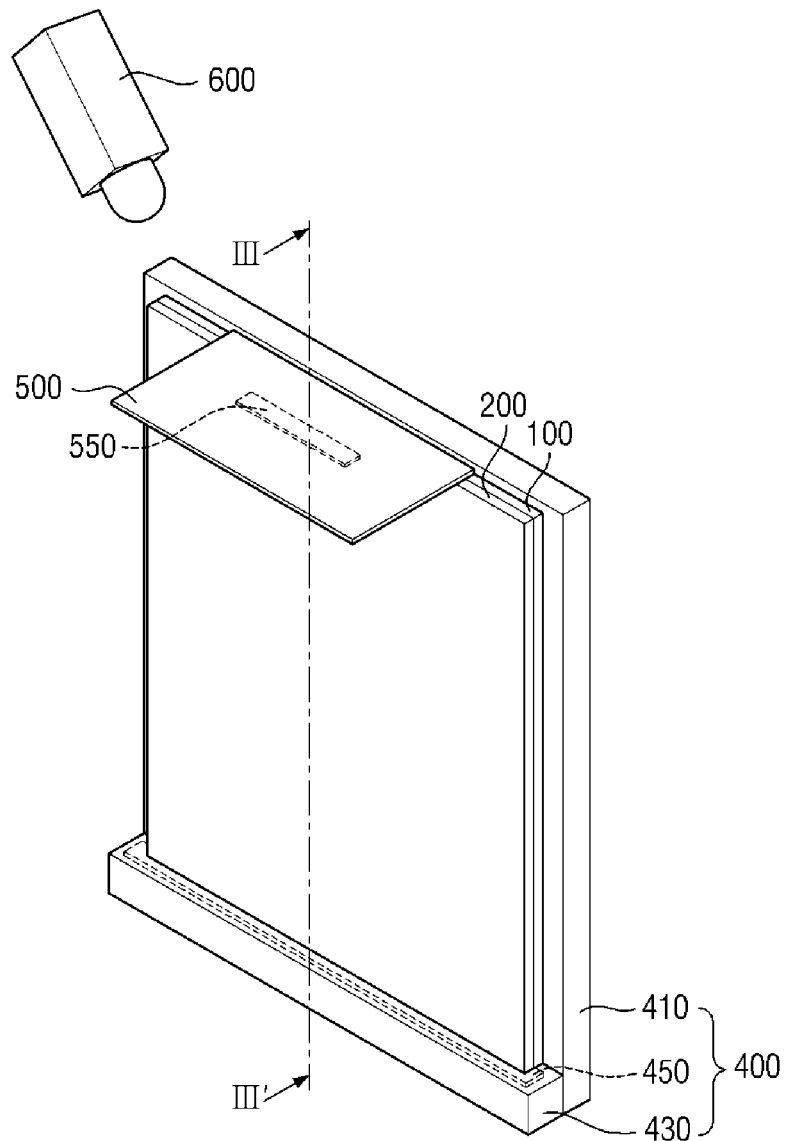
Figure 11:
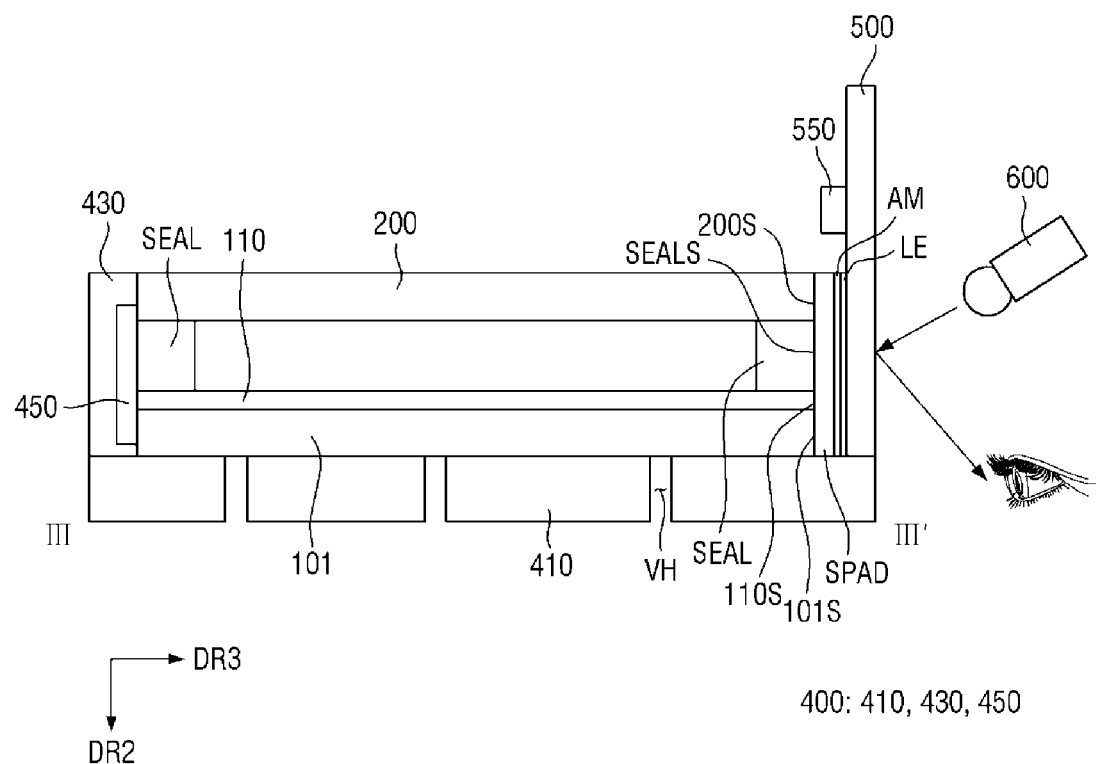
FIG. 11 is a cross-sectional view taken along line III-III' of FIG. 10.

FIG. 1 is a flow chart of a method of manufacturing a display device according to an exemplary embodiment, FIGS. 2, 4, 5, 6, 7, and 10 are perspective views of process operations of the method of manufacturing a display device according to an exemplary embodiment, FIG. 3 is a cross-sectional view taken along line I-I' of FIG. 2, FIG. 8 is a cross-sectional view taken along line II-II of FIG. 7, FIG. 9 is a partial view of FIG. 8, and FIG. 11 is a cross-sectional view taken along line of FIG. 10.

Referring to FIGS. 1 to 11, the method of manufacturing a display device according to an exemplary embodiment may include an operation of fixing a display panel to a stage (S10), an operation of flipping the stage to allow the display panel to stand up (S20), an operation of attaching a printed circuit board to a first side surface of the fixed display panel (S30), and an operation of irradiating light from a lighting to the first side surface of the display panel, and irradiating light from another lighting to a second side surface of the display panel opposite the first side surface of the display panel to check alignment of the printed circuit board (S40).

First, referring to FIGS. 1 to 3, a target panel 1 or a display panel is provided.

The target panel 1 may include a first substrate 100 including a first base substrate 101, a second substrate 200 facing the first substrate 100, and a plurality of connection lines 110 disposed between the first base substrate 101 and the second substrate 200.

As the target panel 1, for example, an organic light emitting display panel may be applied. In exemplary embodiments which will be described later, although an example in which the organic light emitting display panel is applied as the target panel 1 is described, the present disclosure is not limited thereto, and various display panels such as a liquid crystal display ("LCD") panel, a quantum dot organic light emitting display ("QD-OLED") panel, a quantum dot liquid crystal display ("QD-LCD") panel, a quantum nano light emitting display panel ("Nano LED"), a micro LED panel, and the like may be applied as the target panel 1.

The first substrate 100 may further include various elements disposed on the first base substrate 101, and the second substrate 200 may further include a second base substrate and various elements disposed on the second base substrate.

The various elements of the first substrate 100 may include a plurality of insulation layers, plurality of conductive layers, at least one thin film transistor, and organic light emitting elements connected to the at least one thin film transistor.

That is, the first substrate 100 may be a thin film transistor substrate or a back-plate substrate including the at least one thin film transistor.

The second substrate 200 may face the first substrate 100 and may be disposed on the first substrate 100. The second substrate 200 may include an encapsulation substrate configured to encapsulate the organic light emitting elements of the first substrate 100.

Each of the first base substrate 101 of the first substrate 100 and the second base substrate of the second substrate 200 may include a base substrate. Each of the base substrates of the first substrate 100 and the second substrate 200 may include a rigid material such as glass, quartz, or the like.

The first substrate 100 may further include the connection line 110 disposed between the first base substrate 101 and the second substrate 200.

The target panel 1 may have a rectangular shape of which corners each have a right angle in a plan view. The target panel 1 may have long sides and short sides. The short sides of the target panel 1 may be sides that extend in a second direction DR2. The long sides of the target panel 1 may be sides that extend in a first direction DR1. The first substrate 100 and the second substrate 200 may have substantially the same planar shape.

The target panel 1 may include a display area DA located at a center portion thereof, and a non-display area NA located around the display area DA. The display area DA may include a plurality of pixels PX. The non-display area NA may be an area not including the plurality of pixels PX.

A sealing member SEAL may be disposed in the non-display area NA of the target panel 1. The sealing member SEAL may be disposed between the first substrate 100 and the second substrate 200 in the non-display area NA to couple the first substrate 100 and the second substrate 200.

The connection line 110 may pass through the non-display area NA (e.g., the lower short side portion of the non-display area NA in the first direction DR1) from the display area DA of the first substrate 100. The connection line 110 may be electrically connected to the pixels in the display area DA. Since the connection line 110 extends to a first side surface of one end portion of each of the first substrate 100 and the second substrate 200, a first side surface of the connection line 110 and the first side surface of each of the first substrate 100 and the second substrate 200 may be aligned in a thickness direction (i.e., the third direction DR3).

The first base substrate 101 of the first substrate 100 may also include a first side surface of one end portion like the first side surface of the first substrate 100. The first side surface of the first base substrate 101, the first side surface of the connection line 110, and the first side surface of the second substrate 200 may be aligned in a third direction DR3.

The connection line 110 may be plural in number. The plurality of connection lines 110 may be disposed to be spaced apart from each other in the second direction DR2.

The connection line 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An outer surface of the sealing member SEAL may be aligned with a first side surface of each of the first substrate 100 and the second substrate 200, but the invention is not limited thereto.

A side surface pad SPAD may be further disposed on the first side surface of each of the first substrate 100 and the second substrate 200. The side surface pad SPAD may be electrically connected to lead lines of the printed circuit board which will be described later.

The first side surface of each of the first substrate 100 and the second substrate 200 may be polished before the side surface pad SPAD is disposed thereon. More specifically, polishing devices (not shown) are disposed on the first side surface of the first base substrate 101, the first side surface of the second substrate 200, and the first side surface of each of the plurality of connection lines 110, and may polish the first side surface of the first base substrate 101, the first side surface of the second substrate 200, and the first side surface of each of the plurality of connection lines 110 as moving along the surfaces. The polishing device may include, for example, a wheel device. The wheel device may have a circular planar shape with respect to the second direction DR2. The wheel device having the circular planar shape may have a center axis extending along the second direction DR2, and may polish the first side surface of the first base substrate 101, the first side surface of the second substrate 200, and the first side surface of each of the plurality of connection lines 110 by forming a circular shape.

Accordingly, since a first side surface portion (e.g., the lower short side portion in the first direction DR1) of each of the first substrate 100 and the second substrate 200 is polished, the first side surface of the first substrate 100 and the first side surface of the second substrate 200 may be aligned in a direction the second substrate 200 faces the first substrate 100 (i.e., the third direction DR3) after the polishing.

A plurality of side surface pads SPAD may be disposed on the first side surface of the first substrate 100, the first side surface of the second substrate 200, and the first side surfaces of the plurality of connection lines 110 which are polished.

The side surface pads SPAD may be disposed to be spaced apart from each other in the second direction DR2. The side surface pads SPAD may be disposed to contact with the connection lines 110 corresponding thereto in the first direction DR1.

Figure 4:
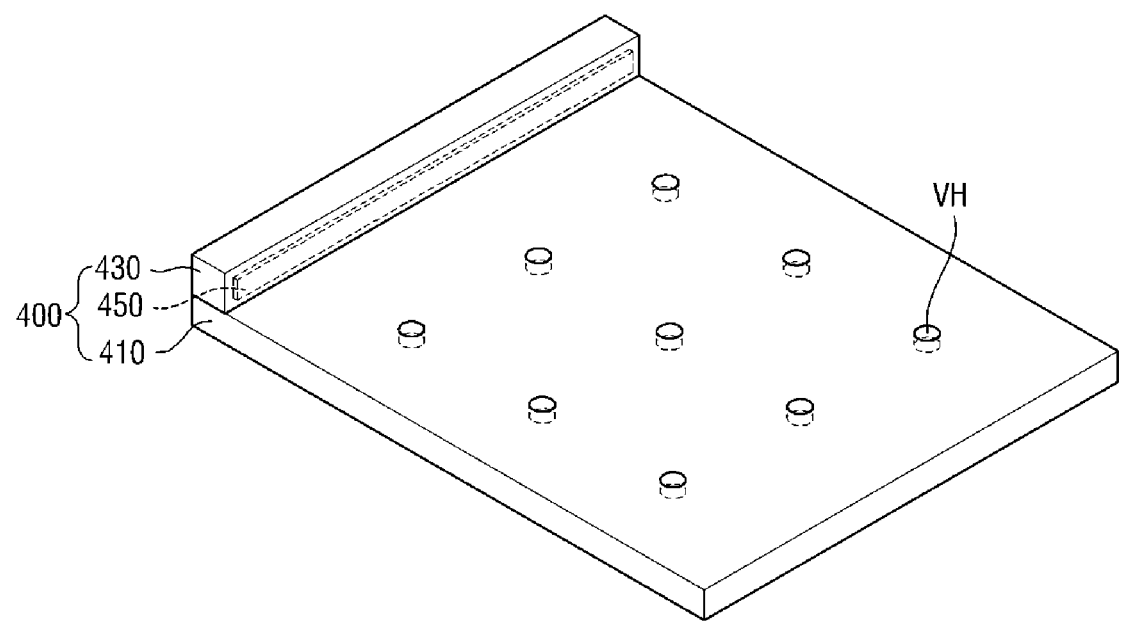
Figure 4:
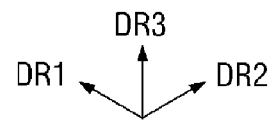

Referring to FIGS. 1 and 4, a stage 400 is provided.

The stage 400 may include a substrate seating and adsorption part 410, a stopper 430 connected to the substrate seating and adsorption part 410, and a light source part 450 connected to the stopper 430.

The substrate seating and adsorption part 410 of the stage 400 may have a rectangular shape in a plan view (i.e., view from the third direction DR3). The substrate seating and adsorption part 410 may have a shape substantially the same as a planar shape of the above-described target panel 1. Since a size of the substrate seating and adsorption part 410 in a plan view may be greater than a size of the target panel 1 in a plan view, an enough space on which the target panel 1 is seated may be provided on the substrate seating and adsorption part 410.

As shown in FIG. 4, the substrate seating and adsorption part 410 may define a plurality of vacuum holes VH passing therethrough in a thickness direction from a surface thereof (i.e., the third direction DR3). In FIG. 4, although an example in which the number of vacuum holes VH arranged in each of the first direction DR1 and the second direction DR2 is described as three, the present disclosure is not limited thereto, and the number of vacuum holes VH arranged in each of the first direction DR1 and the second direction DR2 may be two or four or more, and the vacuum holes VH may be arbitrarily arranged unlike the above.

Since the substrate seating and adsorption part 410 defines the plurality of vacuum holes VH, when the target panel 1 is seated on the substrate seating and adsorption part 410, the substrate seating and adsorption part 410 may serve to stably support the target panel 1 by adsorbing the seated target panel 1 in the third direction DR3 through absorption of air in the vacuum holes VH.

The stopper 430 may be disposed at a first side of the substrate seating and adsorption part 410 in the first direction DR1. The stopper 430 may be extended along the second direction DR2. The stopper 430 may be disposed on a main surface of the substrate seating and adsorption part 410. However, the present disclosure is not limited thereto, and the stopper 430 may be configured in a state of not being disposed on the main surface of the substrate seating and adsorption part 410 and being attached or connected to a side surface of the substrate seating and adsorption part 410.

The stopper 430 supports the target panel 1 when the target panel 1 is flipped in the gravity direction (i.e., so that the long sides of the target panel 1 are extended along the third direction DR3 like FIG. 6) so as to allow the target panel 1 to stand up before attaching the printed circuit board to a first side surface of the target panel 1, and may serve to support the second side surface of the target panel 1 opposite the first side surface of the target panel 1, as will be described later. As used herein, "stand up" refers to a disposition of the target panel 1 that the long sides of the target panel 1 are extended along the gravity direction as shown in FIG. 6.

The light source part 450 may include a plurality of lightings. For example, the light source part 450 may include a first lighting.

The light source part 450 may serve to check whether the alignment between the target panel 1 and the printed circuit board attached to the first side surface of the target panel 1 is faulty by irradiating light to the second side surface (i.e., a side surface of the target panel 1 facing the light source part 450) of the target panel 1, as will be described later.

As shown in FIG. 4, the light source part 450 may be disposed to be embedded in the stage 400. More specifically, the light source part 450 may be disposed in the stopper 430. The light source part 450 may be disposed to be aligned with an inner side surface of the stopper 430.

Subsequently, referring to FIGS. 1 and 5, the target panel 1 is disposed on the stage 400 (S10). That is, the target panel 1 may be fixed to the stage 400.

The operation of fixing the target panel 1 to the stage 400 may include an operation of disposing the target panel 1 on the substrate seating and adsorption part 410 of the stage 400, and an operation of fixing the disposed target panel 1 through the above-described vacuum holes VH of the substrate seating and adsorption part 410 of the stage 400. Since a lower surface (i.e., a surface of the target panel 1 facing the substrate seating and adsorption part 410) of the target panel 1 is adsorbed by absorbing air in the vacuum holes VH, the target panel 1 may be firmly fixed to the substrate seating and adsorption part 410.

The second side surface of the target panel 1 may face the stopper 430, and further, may face the light source part 450 disposed in the stopper 430.

Subsequently, referring to FIGS. 1 and 6, the target panel 1 is stood up by flipping the stage 400 (S20).

In operation S20 in which the target panel 1 is stood up by flipping the stage 400, the stage 400 and the target panel 1 may be flipped together in the previous thickness direction before the flipping (i.e., the third direction DR3), and the substrate seating and adsorption part 410 of the stage 400 and the long sides of the target panel 1 may be stood up to extend in the third direction DR3.

Accordingly, the stopper 430 of the stage 400 may be located at a lower side in the third direction DR3.

In operation S20 in which the target panel 1 is stood up by flipping the stage 400, the vacuum holes VH of the stage 400 may fix the target panel 1.

In operation S20 in which the target panel 1 is stood up by flipping the stage 400, the stopper 430 of the stage 400 may fix the second side surface of the target panel 1. That is, the stopper 430 may directly contact with the second side surface of the target panel 1 to fix the second side surface of the target panel 1 to the stopper 430.

Subsequently, referring to FIGS. 1 and 7 to 9, a printed circuit board 500 is attached to the first side surface of the target panel 1 (S30).

In operation S30 in which the printed circuit board 500 is attached to the first side surface of the target panel 1, the printed circuit board 500 may be attached to the first side surface of the target panel 1 in a state in which the target panel 1 is standing up.

The printed circuit board 500 may include a base film, a plurality of lead lines LE disposed on the base film, and a driving integrated circuit 550 disposed on the base film and connected to the plurality of lead lines LE.

The driving integrated circuit 550 according to an exemplary embodiment may be implemented as a data driving chip, and may be implemented in a chip-on-film ("COF") manner in which a chip is formed on the printed circuit board 500 as described above, but the invention is not limited thereto.

The plurality of lead lines LE may be electrically connected to the side surface pads SPAD of the target panel 1.

An anisotropic conductive film AM may be disposed between the side surface pads SPAD and the lead lines LE. The anisotropic conductive film AM may include a resin layer and a plurality of conductive balls dispersed in the resin layer.

Operation S30 in which the printed circuit board 500 is attached to the first side surface of the target panel 1, may include an operation of disposing the anisotropic conductive film AM on the side surface pads SPAD, and disposing the printed circuit board 500 on the anisotropic conductive film AM.

In the operation of disposing the printed circuit board 500 on the anisotropic conductive film AM, the printed circuit board 500 may be disposed so that the lead lines LE of the printed circuit board 500 and the side surface pads SPAD may be aligned in the first direction DR1.

The conductive balls of the anisotropic conductive film AM may be disposed between the side surface pads SPAD and the lead lines LE, to serve to short the side surface pads SPAD and the lead lines LE.

In the operation of attaching the side surface pads SPAD and the printed circuit board 500 through the anisotropic conductive film AM, while the printed circuit board 500 is compressed in a direction toward the side surface pads SPAD, the anisotropic conductive film AM may be compressed and hardened by applying heat.

In operation S30 in which the printed circuit board 500 is attached to the first side surface of the target panel 1 in the method of manufacturing a display device according to an exemplary embodiment, since the printed circuit board 500 is attached to the first side surface of the target panel 1 in the state in which the target panel 1 is standing up, a compression direction of the anisotropic conductive film AM may be the same as a gravity direction (i.e., a direction opposite the third direction DR3). Accordingly, the anisotropic conductive film AM may be more easily compressed.

Referring to FIG. 8, the side surface pads SPAD may be disposed to contact with the first side surface 101S of the first base substrate 101 and the first side surface 110S of each of the connection lines 110 and the first side surface 200S of the second substrate 200.

The anisotropic conductive film AM may be disposed between the side surface pads SPAD and the lead lines LE of the printed circuit board 500. As described above, the substrate seating and adsorption part 410 of the stage 400 may define the plurality of vacuum holes VH. While the stage 400 adsorbs the one major surface of the target panel 1 (i.e., one major surface facing the substrate seating and adsorption part 410) in the second direction DR2 to fix the target panel 1 to the substrate seating and adsorption part 410 by absorbing air in the plurality of vacuum holes VH, the above-described stopper 430 of the stage 400 may be disposed to contact with the second side surface of the target panel 1 to serve to support the second side surface of the target panel 1.

Referring to FIG. 9, the lead lines LE may be aligned in the first direction DR1. Each of the lead lines LE may be extended along the second direction DR2. The printed circuit board 500 may be aligned so that the lead lines LE and the side surface pads SPAD may correspond to each other. The plurality of lead lines LE may be disposed on the first side surfaces 101S and 110S of the first substrate 100, a first side surface SEALS of the sealing member SEAL, and the first side surface 200S of the second substrate 200.

Subsequently, referring to FIGS. 1, 10, and 11, the first side surface of the target panel 1 is irradiated with light from the second lighting 600, and the second side surface of the target panel 1 opposite the first side surface of the target panel 1 is irradiated with light from the first lighting to check alignment of the printed circuit board (S40).

In the operation of irradiating the second side surface (i.e., the side surface of the target panel 1 facing the light source part 450) of the target panel 1 opposite the first side surface of the target panel 1 with light from the first lighting, the above-described light source part 450 may include the first lighting.

As described above, the light source part 450 may be embedded in the stage 400, and more specifically, may be disposed in the stopper 430 of the stage 400. Accordingly, the first lighting may be disposed in the stopper 430.

The second lighting 600 may irradiate illumination light toward the printed circuit board 500 on the first side surface of the target panel 1.

Referring to FIGS. 10 and 11, in the operation of irradiating the illumination light, by the second lighting 600, toward the printed circuit board 500 on the first side surface of the target panel 1, the second lighting 600 may be disposed on a first major surface of the printed circuit board 500 opposite a second major surface of the printed circuit board 500 facing the target panel 1. The second lighting 600 may include a light emitting unit which is the same as the first lighting, but the invention is not limited thereto.

As shown in FIG. 11, the second lighting 600 may obliquely irradiate the illumination light with respect to an extending direction (i.e., the second direction DR2) of the second surface of the printed circuit board 500.

Further, the light from the first lighting of the light source part 450 may be irradiated toward the first side surface of the target panel 1.

Operation S40 of checking the alignment of the printed circuit board 500 may include an operation of checking alignment between the side surface pad SPAD disposed on the first side surface of the target panel 1 and the lead lines LE of the printed circuit board 500.

Further, the operation of checking the alignment of the printed circuit board 500 may include an operation of checking an indentation due to the conductive balls of the anisotropic conductive film AM disposed between the side surface pads SPAD and the lead lines LE.

As described above, the method of manufacturing a display device according to an exemplary embodiment may include the operation of attaching the printed circuit board 500 to the first side surface of the target panel 1. In an operation of determining whether alignment between the attached printed circuit board 500 and the side surface pads SPAD of the target panel 1 is faulty, if only the second lighting 600 is used, an amount of light for determining whether alignment between the side surface pads SPAD and the lead lines LE is faulty may be insufficient. Further, since the illumination light irradiated to the first side surface of the target panel 1 from the second lighting 600 is reflected by the lead lines LE, the side surface pads SPAD, and a side surface of the base substrate of the target panel 1, checking the alignment of the printed circuit board 500 by contrast of brightness may not be easy. Accordingly, determining whether the alignment between the lead lines LE and the side surface pads SPAD is faulty may be difficult.

However, in the method of manufacturing a display device according to an exemplary embodiment, when whether the printed circuit board 500 is well aligned is determined, since the illumination light provided from the above-described light source part 450 of the stage 400 proceeds toward the printed circuit board 500 on the first side surface of the target panel 1, the amount of light which is not sufficient with only the second lighting 600 may be compensated by the additional light from the light source part 450.

Hereinafter, another exemplary embodiment will be described. In the following exemplary embodiments, components which are the same as those in the above-described exemplary embodiment will be referred to with the same reference numerals, and descriptions of the components will be omitted or simplified.

Figure 12:
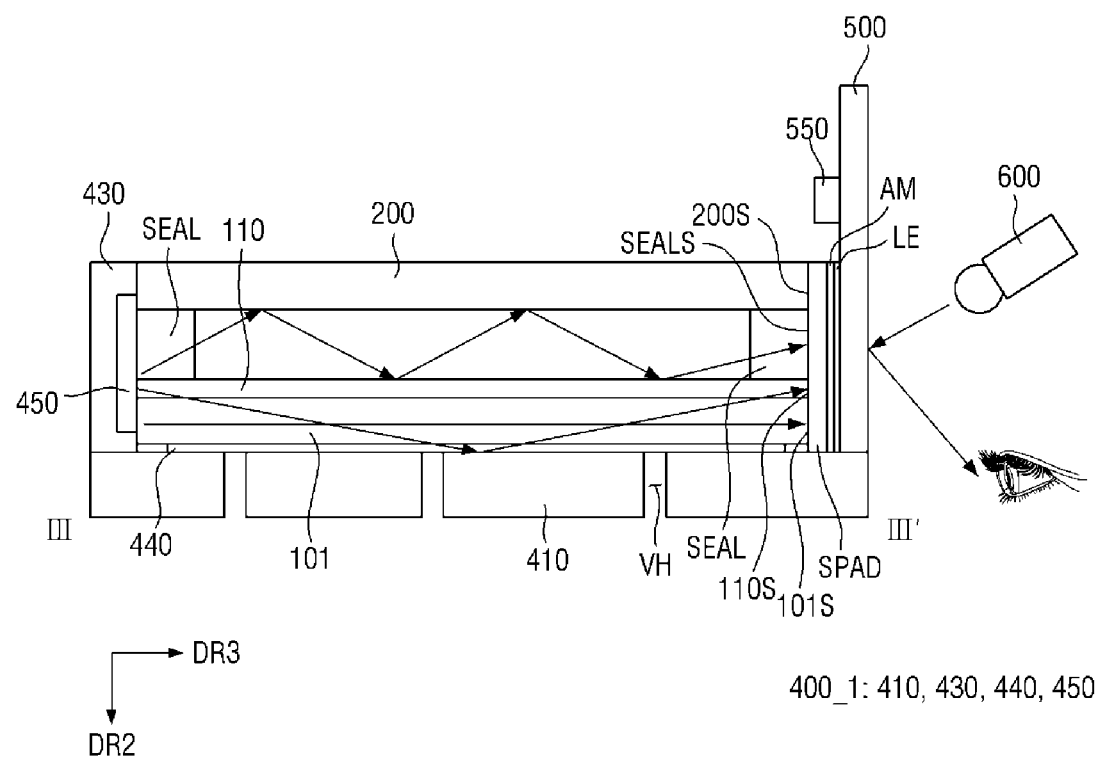
FIG. 12 is a cross-sectional view taken along line III-III' of FIG. 10 according to another exemplary embodiment.

FIG. 12 is a cross-sectional view taken along line III-III' of FIG. 10 according to another exemplary embodiment.

Referring to FIG. 12, a method of manufacturing a display device according to the exemplary embodiment is different from the method of manufacturing a display device according to FIG. 1 in that the operation of checking the alignment of the printed circuit board 500 by irradiating the light from the first lighting on the second side surface of the target panel 1 opposite the first side surface of the target panel 1 includes an operation of reflecting the light irradiated from the first lighting by a reflection layer 440 disposed between the target panel 1 and the substrate seating and adsorption part 410 of a stage 400_1 to check the alignment of the printed circuit board 500.

More specifically, in the method of manufacturing a display device according to the exemplary embodiment, the operation of checking the alignment of the printed circuit board 500 by irradiating the light from the first lighting on the second side surface of the target panel 1 opposite the first side surface of the target panel 1 may include the operation of reflecting the light irradiated from the first lighting by the reflection layer 440 disposed between the target panel 1 and the substrate seating and adsorption part 410 of the stage 400_1 to check the alignment of the printed circuit board 500.

That is, the stage 400_1 according to the exemplary embodiment may further include the reflection layer 440 disposed on a major surface of the substrate seating and adsorption part 410 facing the target panel 1. As described above, the reflection layer 440 may serve to reflect light which proceeds to the substrate seating and adsorption part 410 among the illumination light provided from the first lighting so that the reflected light may proceed in a direction opposite the direction toward the substrate seating and adsorption part 410 again. Accordingly, an amount of light provided toward the first side surface of the target panel 1 and the printed circuit board 500 from the light source part 450 may be increased.

As described above, the method of manufacturing a display device according to the exemplary embodiment may also include the operation of attaching the printed circuit board 500 to the first side surface of the target panel 1. In the operation of determining whether the alignment between the attached printed circuit board 500 and the side surface pads SPAD of the target panel 1 is faulty, if only the second lighting 600 is used, the amount of the light for determining whether the alignment between the side surface pads SPAD and the lead lines LE is faulty may be insufficient. Further, since the illumination light irradiated to the first side surface of the target panel 1 from the second lighting 600 is reflected by the lead lines LE, the side surface pads SPAD, and the side surface of the base substrate of the target panel 1, checking the alignment of the printed circuit board 500 by the contrast of brightness may not be easy. Accordingly, determining whether the alignment between the lead lines LE and the side surface pads SPAD is faulty may be difficult.

However, in the method of manufacturing a display device according to the exemplary embodiment, when whether the printed circuit board 500 is aligned is determined, since the light provided from the above-described light source part 450 of the stage 400_1 proceeds toward the printed circuit board 500 on the first side surface of the target panel 1, the amount of light which is not sufficient with only the second lighting 600 may be compensated by the light provided from the above-described light source part 450.

Figure 13:
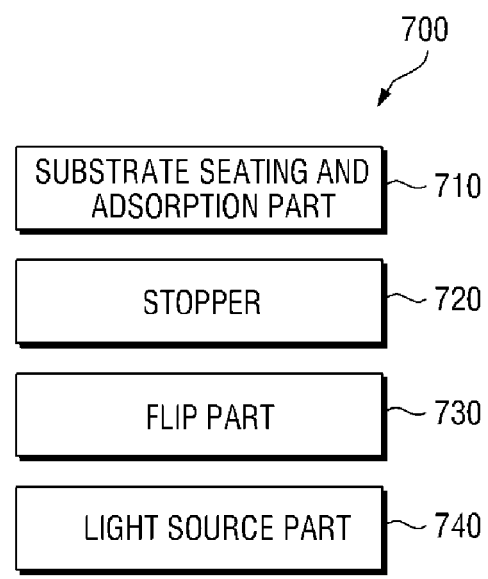
FIG. 13 is a block diagram of a device for manufacturing a display device according to an exemplary embodiment.

FIG. 13 is a block diagram of a device for manufacturing a display device according to an exemplary embodiment.

Referring to FIG. 13, a device 700 for manufacturing a display device according to an exemplary embodiment may include a substrate seating and adsorption part 710, a stopper 720, a flip part 730, and a light source part 740.

The device 700 for manufacturing a display device according to the exemplary embodiment may have a configuration which is substantially the same as the stage 400 shown in FIG. 4. More specifically, the substrate seating and adsorption part 710 of the device 700 for manufacturing a display device may have a rectangular shape in a plan view. The substrate seating and adsorption part 710 may have a shape that is substantially the same as the planar shape of the above-described target panel 1. A size of the substrate seating and adsorption part 710 in a plan view may be greater than a size of the target panel 1 in a plan view, and thus the enough space on which the target panel 1 is seated may be provided on the substrate seating and adsorption part 410.

Like FIG. 4, the substrate seating and adsorption part 710 may define a plurality of vacuum holes VH passing therethrough in a thickness direction from a surface thereof Since the substrate seating and adsorption part 710 defines the plurality of vacuum holes VH, when the target panel 1 is seated on the substrate seating and adsorption part 710, the substrate seating and adsorption part 710 may serve to stably support the target panel 1 by adsorbing the seated target panel 1 through absorption of air in the vacuum holes VH.

The stopper 720 may be disposed at a side of the substrate seating and adsorption part 710 in one direction. The stopper 720 may be disposed on the substrate seating and adsorption part 710. However, the present disclosure is not limited thereto, and the stopper 720 may be configured in a state of not being disposed on the substrate seating and adsorption part 710 and being attached or connected to a side surface of the substrate seating and adsorption part 710.

The stopper 720 supports the target panel 1 when the target panel 1 is flipped in a gravity direction (i.e., a direction opposite the third direction DR3) so as to allow the target panel 1 to stand before attaching the printed circuit board 500 to a first side surface of the target panel 1, and may serve to support a second side surface of the target panel 1 opposite the first side surface of the target panel 1, as will be described later.

The flip part 730 may serve to flip the target panel 1 in the gravity direction (i.e., a direction opposite the third direction DR3).

The light source part 740 may include a plurality of lightings. For example, the light source part 740 may include a first lighting.

The light source part 740 may serve to check whether the alignment between the target panel 1 and the printed circuit board 500 attached to the first side surface of the target panel 1 is faulty by irradiating light toward the first side surface of the target panel 1.

The light source part 740 may be disposed in the stopper 720. The light source part 740 may be disposed to be aligned with an inner side surface of the stopper 720.

Figure 14:
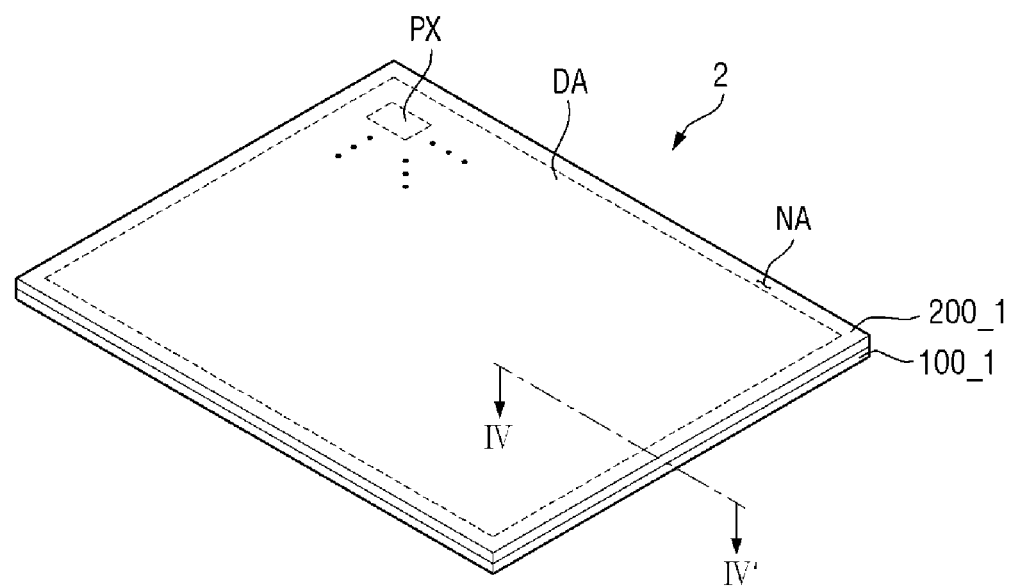
FIGS. 14, 16, and 17 are perspective views of process operations of a method of manufacturing a display device according to another exemplary embodiment.
Figure 14:
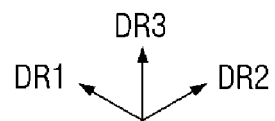
Figure 15:
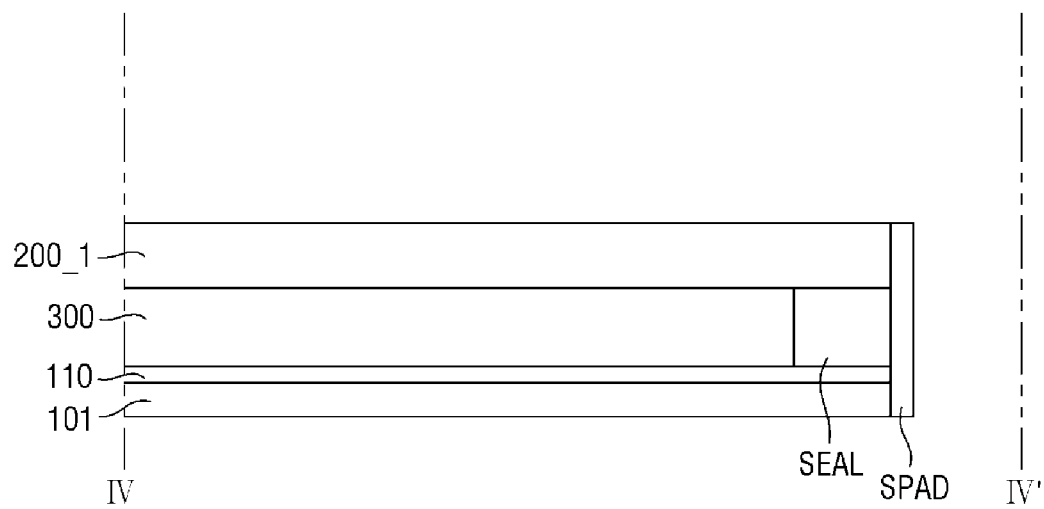
FIG. 15 is a cross-sectional view taken along line IV-IV' of FIG. 14.
Figure 16:
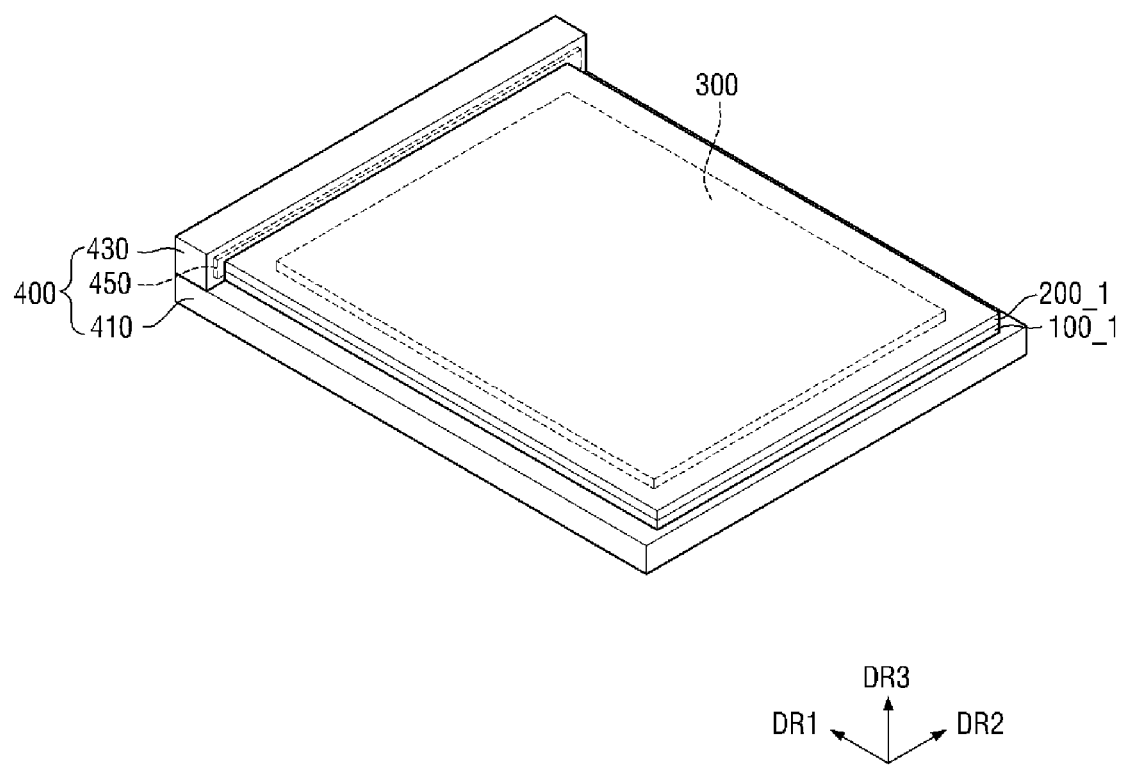
Figure 17:
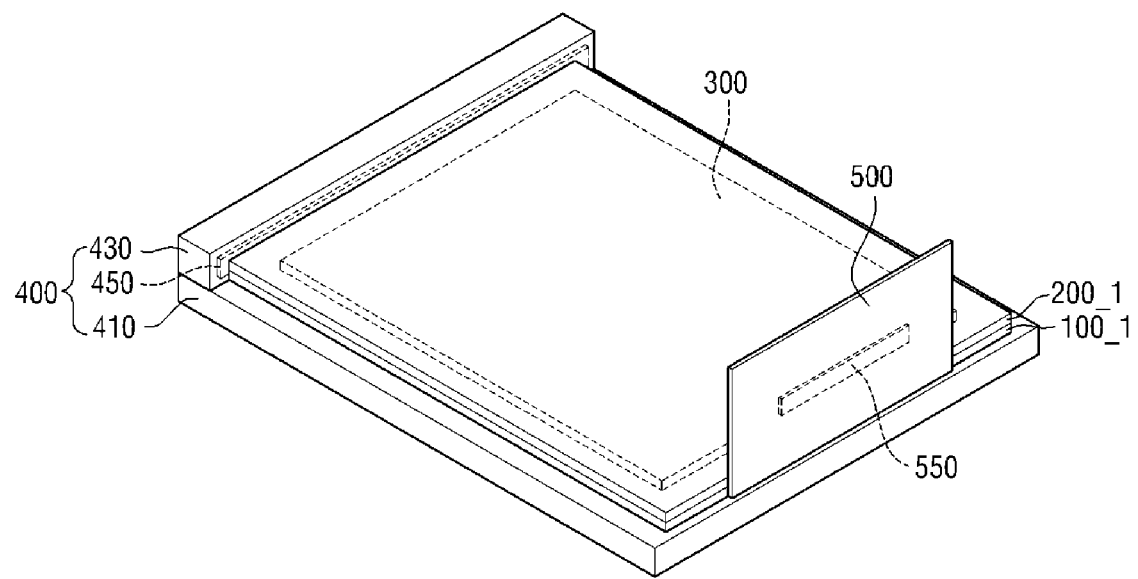
Figure 17:
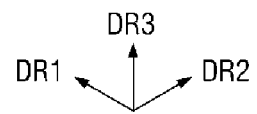

FIGS. 14, 16, and 17 are perspective views of process operations of a method of manufacturing a display device according to another exemplary embodiment, and FIG. 15 is a cross-sectional view taken along line IV-IV' of FIG. 14.

Referring to FIGS. 14 to 17, the method of manufacturing a display device according to the exemplary embodiment is different from the method of manufacturing a display device according to the previous exemplary embodiments in that a liquid crystal display panel is applied as a target panel 2.

A liquid crystal layer 300 may be further disposed between a first substrate 100_1 and a second substrate 200_1. A sealing member SEAL may be disposed at an outer side of the liquid crystal layer 300. The liquid crystal layer 300 may directly contact with the sealing member SEAL, but the invention is not limited thereto.

The first substrate 100_1 may further include various elements disposed on a first base substrate 101, and a second substrate 200_1 may further include a second base substrate and various elements disposed on the second base substrate.

The various elements of the first substrate 100_1 may include a plurality of insulation layers, a plurality of conductive layers, and at least one thin film transistor.

That is, first substrate 100_1 may be a thin film transistor substrate or a back-plate substrate including the at least one thin film transistor, The second substrate 200_1 may face the first substrate 100_1 and may be disposed on the first substrate 100_1. The second substrate 200_1 may be a color filter substrate including a color filter layer.

The method of manufacturing a display device according to this exemplary embodiment may not include an operation of allowing the target panel 2 to stand by flipping a stage 400 (S20) between an operation of disposing the target panel 2 on the stage 400 (S10) and an operation of attaching a printed circuit board 500 to a first side surface of the target panel 2 (S30).

In operation S30 in which the printed circuit board 500 is attached to the first side surface of the target panel 2, the printed circuit board 500 may be attached to the first side surface of the target panel 2 in a state in which the target panel 2 is laid.

As described above, the method of manufacturing a display device according to the exemplary embodiment may also include the operation of attaching the printed circuit board 500 to the first side surface of the target panel 2. In the operation of determining whether alignment between the attached printed circuit board 500 and side surface pads SPAD of the target panel 2 is faulty, if only a second lighting 600 is used, an amount of light for determining whether alignment between the side surface pads SPAD and lead lines LE is faulty may be insufficient. Further, since illumination light irradiated to the first side surface of the target panel 2 from the second lighting 600 is reflected by the lead lines LE, the side surface pads SPAD, and a side surface of a base substrate of the target panel 2, checking the alignment of the printed circuit board 500 by contrast of brightness may not be easy. Accordingly, determining whether the alignment between the lead lines LE and the side surface pads SPAD is faulty may be difficult.

However, in the method of manufacturing a display device according to the exemplary embodiment, when whether the printed circuit board 500 is aligned is determined, since the light provided from a light source part 450 of the above-described stage 400 proceeds toward the printed circuit board 500 on the first side surface of the target panel 2, the amount of the light which is not sufficient with only the second lighting 600 may be compensated by the light provided from the light source part 450.

In a method of manufacturing a display device, and a device for manufacturing a display device according to an exemplary embodiment of the present disclosure, alignment between a side surface pad and a lead line bonded at a side surface of a display panel can be checked.

Effects according to the present disclosure are not limited to the above, and further various effects are included in the specification.

As described above, although the exemplary embodiments of the present disclosure are mainly described, the above are only examples and not intended to limit the present disclosure, and those skilled in the art may perform modifications and applications which are not described above within the scope not departing from the essential characteristics of the present disclosure. For example, the elements specifically shown in the exemplary embodiments of the present disclosure may be modified. Further, differences related to the modifications and the applications should be included in the scope of the present disclosure as defined in the claims.

What is claimed is:

1. A method of manufacturing a display device, comprising:
   an operation of fixing a display panel to a stage;
   an operation of attaching a printed circuit board to a first side surface of the fixed display panel; and
   an operation of irradiating the first side surface of the display panel with light from a first lighting, and irradiating a second side surface of the display panel opposite the first side surface of the display panel with light from a second lighting to check alignment of the printed circuit board.

2. The method of claim 1, wherein the display panel is fixed through absorption of air in a vacuum hole of the stage in the operation of fixing the display panel to the stage.

3. The method of claim 2, further comprising an operation of flipping the stage to allow the display panel to stand up, between the operation of fixing the display panel and the operation of attaching the printed circuit board.

4. The method of claim 3, wherein the stage keeps fixing of the display panel in the operation of flipping the stage to allow the display panel to stand up.

5. The method of claim 4, wherein a stopper of the stage fixes the second side surface of the display panel in the operation of flipping the stage to allow the display panel to stand up.

6. The method of claim 5, wherein the printed circuit board is attached to the first side surface of the display panel in a state in which the display panel is stood up in the operation of attaching the printed circuit board to the first side surface of the fixed display panel.

7. The method of claim 5, wherein the second lighting is embedded in the stage in the operation of irradiating the second side surface of the display panel opposite the first side surface of the display panel with light from the second lighting.

8. The method of claim 7, wherein the second lighting is disposed in the stopper of the stage.

9. The method of claim 2, wherein the operation of irradiating the second side surface of the display panel opposite the first side surface of the display panel with light from the second lighting to check the alignment of the printed circuit board includes an operation of reflecting the light irradiated from the second lighting through a reflection layer disposed between the display panel and the stage to check the alignment of the printed circuit board.

10. The method of claim 2, wherein the printed circuit board is attached to the first side surface of the display panel in a state in which the display panel is laid in the operation of attaching the printed circuit board to the first side surface of the fixed display panel.

11. The method of claim 10, wherein the display panel includes a liquid crystal display panel.

12. The method of claim 1, wherein the operation of checking the alignment of the printed circuit board includes an operation of checking alignment between a side surface pad disposed on the first side surface of the display panel and a lead line of the printed circuit board.

13. The method of claim 12, wherein the operation of checking the alignment of the printed circuit board includes an operation of checking an indentation due to a conductive ball of an anisotropic conductive film disposed between the side surface pad and the lead line.

14. A device for manufacturing a display device, comprising:
    a substrate seating and fixing part which seats a display panel thereon and fixes the display panel;
    a stopper connected to the substrate seating and fixing part and disposed on a second side surface of the display panel; and
    a light source part connected to the stopper and which irradiates the second side surface of the display panel with illumination light.

15. The device of claim 14, wherein the substrate seating and fixing part defines a plurality of vacuum holes passing through a surface thereof in a thickness direction.

16. The device of claim 15, wherein the light source part is disposed in the stopper.

17. The device of claim 16, wherein the illumination light irradiated from the light source part proceeds from the second side surface of the display panel to a first side surface of the display panel opposite the second side surface of the display panel.

18. The device of claim 17, further comprising a reflection layer disposed on a major surface of the substrate seating and fixing part, wherein the reflection layer reflects the illumination light provided from the light source part.

19. The device of claim 14, further comprising a flip part, wherein the flip part allows the laid display panel to stand up.

20. The device of claim 19, wherein the stopper supports the second side surface of the display panel opposite the first side surface of the stood display panel.

* * * * *